United States Patent [19]

Robbins

[11] Patent Number: 4,481,597
[45] Date of Patent: Nov. 6, 1984

[54] BOREHOLE SPECTRAL ANALOG TO DIGITAL CONVERTER

[75] Inventor: Carl A. Robbins, Houston, Tex.

[73] Assignee: Halliburton Company, Duncan, Okla.

[21] Appl. No.: 312,053

[22] Filed: Oct. 16, 1981

[51] Int. Cl.³ .................. G06J 1/00; G01V 5/00; H03K 13/20
[52] U.S. Cl. .................. 364/604; 250/262; 340/347 NT
[58] Field of Search ............ 364/604, 605; 340/347 AD, 347 NT, 347 CC; 250/262, 263, 264

[56] References Cited

U.S. PATENT DOCUMENTS

| | | | |
|---|---|---|---|
| 3,192,371 | 6/1965 | Brahm | 364/605 |
| 3,421,093 | 1/1969 | Hinrichs et al. | 340/347 NT |
| 3,667,055 | 5/1972 | Uchida | 340/347 NT |
| 3,678,500 | 7/1972 | Bauer | 340/347 NT |
| 3,688,305 | 8/1972 | Goldsworthy | 340/347 NT |
| 3,765,012 | 10/1973 | Grutzediek et al. | 340/347 NT |
| 3,786,491 | 1/1974 | Carleton | 340/347 NT |
| 3,879,724 | 4/1975 | McDonald | 340/347 NT |
| 3,893,103 | 7/1975 | Prill | 340/347 NT |
| 4,042,824 | 8/1977 | Pitts, Jr. et al. | 250/263 |
| 4,086,656 | 4/1978 | Brown | 340/347 NT |
| 4,364,028 | 12/1982 | Masuda et al. | 340/347 NT |

OTHER PUBLICATIONS

Sheingold: Analog-Digital Conversion Handbook (Analog Devices Inc.) pp. I-21 to I23, FIG. 4a of Interest.

Primary Examiner—Felix D. Gruber
Attorney, Agent, or Firm—W. J. Beard

[57] ABSTRACT

For use with a photomultiplier tube responding to gamma ray induced scintillation pulses in a well logging sonde, a system having the preferred and illustrated embodiment of an input amplifier DC connected with a differential amplifier output to an integrating amplifier. The integrating amplifier is output to another differential amplifier then output to a sample and hold amplifier. This provides the input for a successive approximation digitizer. A feedback loop is incorporated in the system connected from the output of the integrating amplifier. It detects an error component due to noise, offset voltage, and drift accumulated at the integrator. It comprises a track and hold amplifier which is output to a pair of voltage comparators, one determining an excessive negative value and the other determining an excessive positive value. The two comparators are input to appropriate up and down terminals of a bidirectional counter. The counter is output to a digital to analog converter which forms a feedback analog voltage for the differential amplifier. The scintillation pulses are integrated over a specified time interval. That value is digitized after selection by the sample and hold amplifier. Moreover, base line drift is eliminated by operation of the feedback loop.

11 Claims, 4 Drawing Figures

BOREHOLE SPECTRAL ANALOG TO DIGITAL CONVERTER

BACKGROUND OF THE DISCLOSURE

This disclosure is directed to a borehole spectral analog to digital converter or spectrum analyzer. It is a device especially suited for use with a photomultiplier tube functioning as a scintillation pulse detector. The system converts photomultiplier tube analog pulse outputs into digital representations of such pulses. These digital representations have the form of numbers that represent the energy of gamma rays or other nuclear radiations causing scintillations in a detector crystal optically coupled to the PMT. Other techniques have been used heretofore and some of their limitations are noted. One approach used in the past is the Wilkinson ramp technique in which the PMT pulses are integrated onto a capacitor which controls a counter during discharge. The counter output is the digitized value. Another approach used heretofore is the peak detector approach in which the highest voltage pulse transient is sensed and stored in a sample and hold gate. An analog to digital converter digitizes this temporarily stored value. The peak detection approach utilizes a fixed conversion time and is deemed to be relatively complex and especially sensitive to temperature drift. The Wilkinson ramp technique has a variable conversion time which depends on pulse amplitude and is also temperature sensitive. A number of errors arise as a result of temperature drift including variations in gain, offset, and other nonlinear errors in the integration.

Various devices have been provided heretofore including U.S. Pat. No. 4,042,824. That is a dual system spectral analog to digital converter. As shown in FIG. 1 of that disclosure, radiation is detected and the pulses are stretched, and then input for digitizing. The digital value is stored in a register. Among other things, the performance of that system is sensitive to the adjustment of the pulse stretcher. U.S. Pat. No. 3,421,093 discloses a base line correction system utilizing a feedback loop with sample and hold circuits in it. It is intended primarily for base line correction. U.S. Pat. No. 3,192,371 discloses a reversible counter and a digitizer cooperative with the counter. It is a system intended primarily for proportional digitizing in an integrating system. U.S. Pat. No. 3,765,012 discloses a reversible counter in a feedback loop cooperative with an integrator. By and large, these devices do not provide the advantages which are found in the disclosed apparatus. This disclosure sets forth a borehole scintillation digitizer. Temperature drift inevitably encountered in severe conditions in a down hole sonde is readily accommodated. The drift is inevitable as the device is lowered deeper and deeper into a borehole. The system incorporates a feedback loop which encounters the drift arising from noise, voltage, error integration and forms a feedback signal to cancel this error.

This system converts the output signal of the photomultiplier tube into proportional voltage pulses which are summed at an integrating amplifier. They are summed to form a DC value which is proportional to the charge from the photomultiplier tube which is integrated over a period of time. This assists in converting the incident gamma ray on the photomultiplier tube into a proportional value. This is dynamic over a period of time and is, therefore, more representative of gamma ray energy impingement on the photomultiplier tube in contrast with simple peak detection. Moreover, the feedback system which is incorporated not only compensates for temperature induced errors but it also overcomes noise generated at the photomultiplier tube (PMT hereafter). The feedback loop thus corrects for such errors and restores the output signal to the correct integral sum over a time period of PMT output. This value is digitized and transmitted to the surface from the sonde.

This disclosure not only sets forth apparatus but also describes a method by which the signal from the PMT is integrated and digitized. It contemplates integration of the PMT output signal over a defined time interval. This input analog scintillation signal, after integration, is periodically sampled to obtain a peak value which is representative of the sum. This peak value is digitized to form a digital value or word for easy transmission to the surface. Moreover, this procedure forms an offset signal to cancel noise, voltage, and drift arising from temperature drift. All errors from multiple sources are summed with the input signal in advance of integration to offset cumulative errors recognized in the input signal typically arising from noise or temperature drift.

BRIEF SUMMARY OF THE INVENTION

This apparatus is summarized as a system incorporating an input amplifier connected to a PMT, a differential amplifier DC connected to the input amplifier, and an integrating amplifier connected to the differential amplifier. That, in turn, provides an output to a sample and hold amplifier which is input to a digitizer. A feedback loop is defined in the system connected from the output of the integrator back to the input of the differential amplifier. The feedback system forms the offset voltage to correct for temperature and noise drift.

BRIEF DESCRIPTION OF THE DRAWINGS

So that the manner in which the above recited features, advantages and objects of the invention, as well as others, which will become apparent, are attained and can be understood in detail, a more particular description of the invention, briefly summarized above, may be had by reference to the embodiments thereof illustrated in the appended drawings, which drawings form a part of this specification. It is to be noted, however, that the appended drawings illustrate only typical embodiments of the invention and are not to be considered limiting of its scope, for the invention may admit to other equally effective embodiments.

DETAILED DESCRIPTION OF PREFERRED EMBODIMENT

Figures 3, 4:
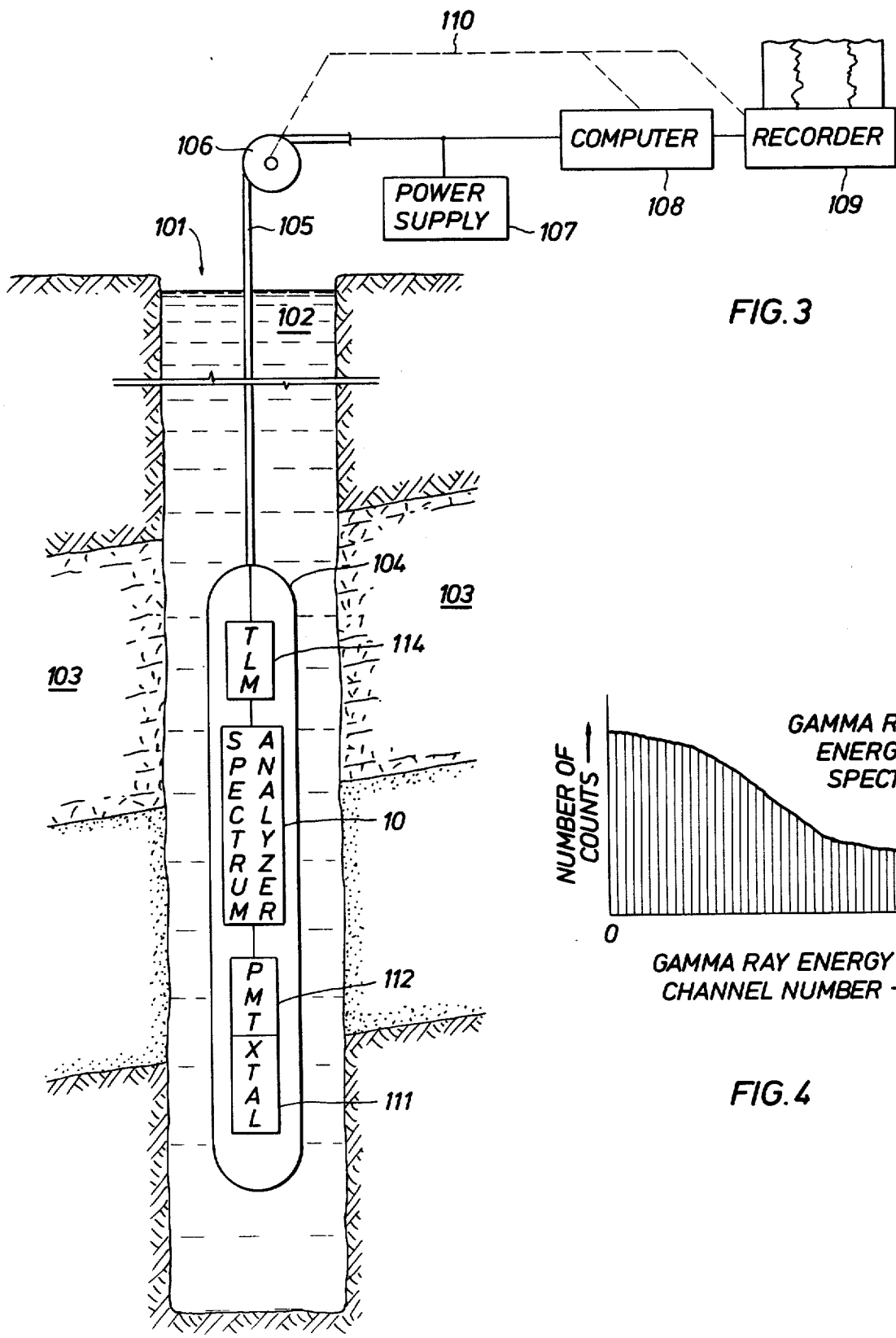
FIG. 3 sets forth a well bore in which the present apparatus is lowered to obtain gamma ray energy measurements along the well bore.
FIG. 4 is a chart of logged gamma ray energy at several locations along the well bore.

Referring initially to FIG. 3, a well logging system in accordance with the present invention is shown schematically. A well borehole 101 filled with a well fluid 102 penetrates earth formations 103 possessing physical properties to be measured. A well logging sonde 104, sized and adapted for passage through the borehole 101, is suspended via a conventional armored logging cable 105 from the surface of the earth. Conductors of logging cable 105 are connected at the surface to a power supply 107, to a surface processing and control computer 108 and to the recorder 109 to supply depth information thereto. Thus data from the downhole sonde 104 may be sent to the surface via the cable 105, processed by computer 108 in the desired manner, and displayed via recorder 109 as a function of the depth of logging sonde 104 in the borehole 101.

The sonde 104 comprises a fluid tight housing containing therein a radiation detector system comprising a scintillation crystal 111 which is optically coupled to a photomultiplier tube 112 (PMT). The output of PMT 112 is coupled to an analog to digital spectrum analyzer 10 which will be discussed in more detail subsequently with respect to FIGS. 1 and 2. The digital output of the spectrum analyzer 10 is coupled to a telemetry system 114 which transmits the information to the surface equipment via conductors of logging cable 105. While not shown, it will be appreciated by those skilled in the art, that downhole sonde 104 is also equipped with suitable power supplies or converters, of a conventional nature, to provide the downhole electronic equipment with operating voltages by converting the power supplied from the surface power supply 107 present on the cable 105 conductors.

Referring now to FIG. 4, as gamma ray energy spectrum, such as that produced by the downhole spectrum analyzer 10 is illustrated schematically. This spectrum comprises a graphic display of the number of gamma ray counts as a function of gamma ray energy or channel number. The spectrum analyzer 10 functions to convert PMT 112 output pulses into digital numbers which represent the intensity of light flashes occurring in the crystal 111. It is a well known phenomena that the intensity of these light flashes is proportional to the energy of the gamma radiation passing through the crystal 111. Suitable processing of these data by the surface computer log can be made to yield valuable information about the physical properties of the earth formations 103 penetrated by the borehole 101.

Figure 1:
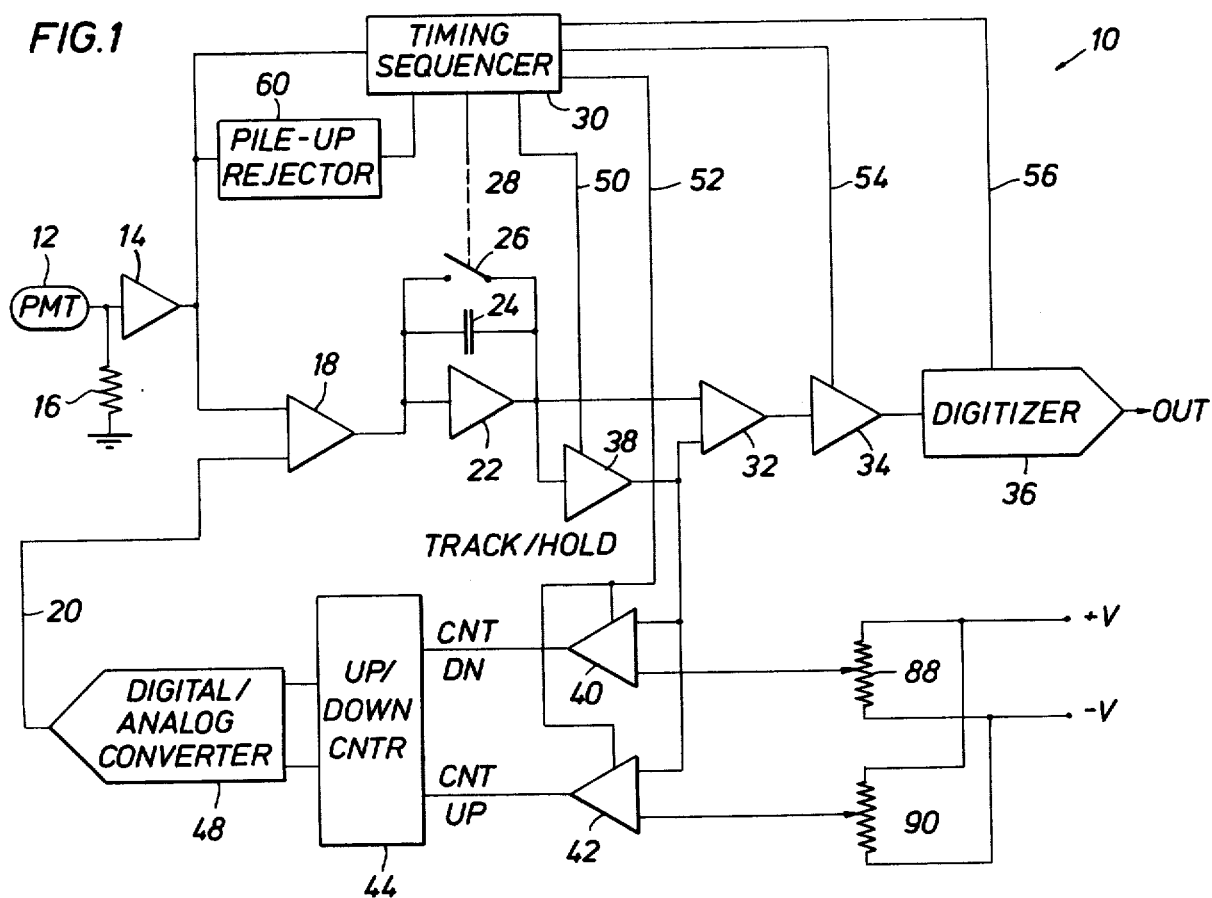
FIG. 1 is a schematic block diagram setting forth the arrangement of the components of the digitizing system of the present disclosure.

Attention is directed to FIG. 1 of the drawings where the borehole spectral digitizer is generally identified by the numeral 10. All of the apparatus in FIG. 1 is adapted to be located within a down hole sonde which is lowered in a borehole to some depth and is thereby exposed to great temperature extremes and very rugged environmental circumstances. The apparatus includes a scintillator at the PMT 12. The light flashes which are formed at the PMT 12 are sensed by the PMT and an output current is formed for a buffer amplifier 14. A suitable load resister for the PMT 12 is included at 16. The amplifier 14 is input to a differential amplifier 18. The connection is a DC circuit connection. In fact, all of the components described in FIG. 1 are DC coupled. That is to say, no coupling capacitors are incorporated to thereby enable direct connection of DC components from stage to stage.

The differential amplifier 18 has two inputs, one of which is from the PMT 12. The other is on a conductor 20 which is a portion of a feedback loop which will be described in detail hereinafter. The output of the differential amplifier 18 is input to an integrating amplifier 22. The integrating amplifier 22 has a summing or integration capacitor 24 connected from output to input. In addition, there is a switch 26 connected across the integrating amplifier 22. The switch 26 is a shorting switch. It is periodically closed. In the preferred and illustrated embodiment, it is an electronic switch which is periodically closed for the express purpose of removing the stored charge on the capacitor 24. This charge is reduced to some nominal small value periodically depending on operation of the electronic switch 26. The switch 26 is controlled by a signal on a conductor 28 from a timing sequencer circuit 30. Its operation will be described on referring to the wave forms of FIG. 2.

The integrator 22 forms an output signal. The output signal is input to a differential amplifier 32. The output of the amplifier 32 is then input to a sample and hold amplifier 34. That signal is then input to a digitizer 36 which forms an output signal suitably digitized for easy transfer to the surface from the sonde in which this equipment is located. The digitizer 36 is preferably of the successive approximation type and is more accurate than ramp forming converters.

The integrator 22 forms an output signal for another amplifier 38. The amplifier 38 is a track and hold amplifier. The amplifier 38 forms an output signal which is input to the differential amplifier 32. Also, the amplifier 38 forms a signal which is input to a pair of comparators. The first of these is an upper limit comparator 40. The second is a lower limit comparator 42. Set voltages are provided for each comparator and are input to opposite input terminals. They are selected at suitable voltage dividers to be described in FIG. 1. They form fixed voltages used for purposes of comparison, and when a crossover occurs at either comparator 40 or 42, an output pulse is formed by saturation of the respective amplifier 40 or 42. The output pulses of the comparators 40 and 42 are pulses causing a bidirectional counter 44 to count up or down. The counter has two input terminals, one for counting up and another for counting down. The two input terminals are arranged to increment or decrement the count stored in the counter 44. This count has the form of a multibit digital word. It is stored in the counter and increases or decreases depending on the last pulse received. Whatever the case, it is a digital word which is converted into an analog value by a digital to analog converter 48 at the output of the counter 44. The analog output of the converter 48 is input to the feedback conducter 20 and back to the differential amplifier 18.

Certain of the equipment is timed in operation. The timing sequencer 30 forms a signal which triggers closure of the switch 26. The switch is normally held open to allow continuous integration. The sequencer 30 is triggered by pulses from the buffer 14. On triggering, the sequencer 30 generates a delay after which the switch 26 is momentarily closed and reopened to integrate the next gamma current pulse from the PMT 112. In like fashion, the conductor 50 input to the amplifier 38 triggers its operation periodically. It is triggered on and off. The conductor 52, from the sequencer 30, conducts an enable signal to the comparators 40 and 42 to enable them to operate. They are triggered on in a timed manner. The sample and hold amplifier 34 is connected by a conductor 54 to the sequencer and it is also triggered on. Finally, a conductor 56 input to the digitizer 36 provides an instruction signal to it to cause digitizing of the input analog voltage by the digitizer 36.

The spectral A to D converter system 10 of the present invention also includes a signal pileup rejector 60. The rejector 60 has an input from the buffer amplifier 14 and forms a defeat output signal for the timing sequencer 30. This occurs in the rare circumstance that the system is overdriven so that the data would be meaningless. In that event, a signal is formed for the timing sequencer 30 to interrupt the cycle of operation and abort that portion of data. This is accomplished relatively easily by simply restarting the equipment and shorting across the integration capacator 24.

The foregoing sets forth the structure. The operation of the spectral A to D conversion system 10 should be considered now. Focusing on the differential amplifier 18, it has the input variable signal offset by the feedback signal on the conductor 20. The feedback signal carries with it the accumulated amplifier offsets for errors. This includes noise components. This also includes DC offsets in the integration system which comprises the feedback loop.

The output of the amplifier 18 is then applied to the integrator. The integrator sums for an interval determined by the opening of the switch 26. This enables the output of the integrator 22 to form a ramp which is a DC output proportional to the total input current.

Figure 2:
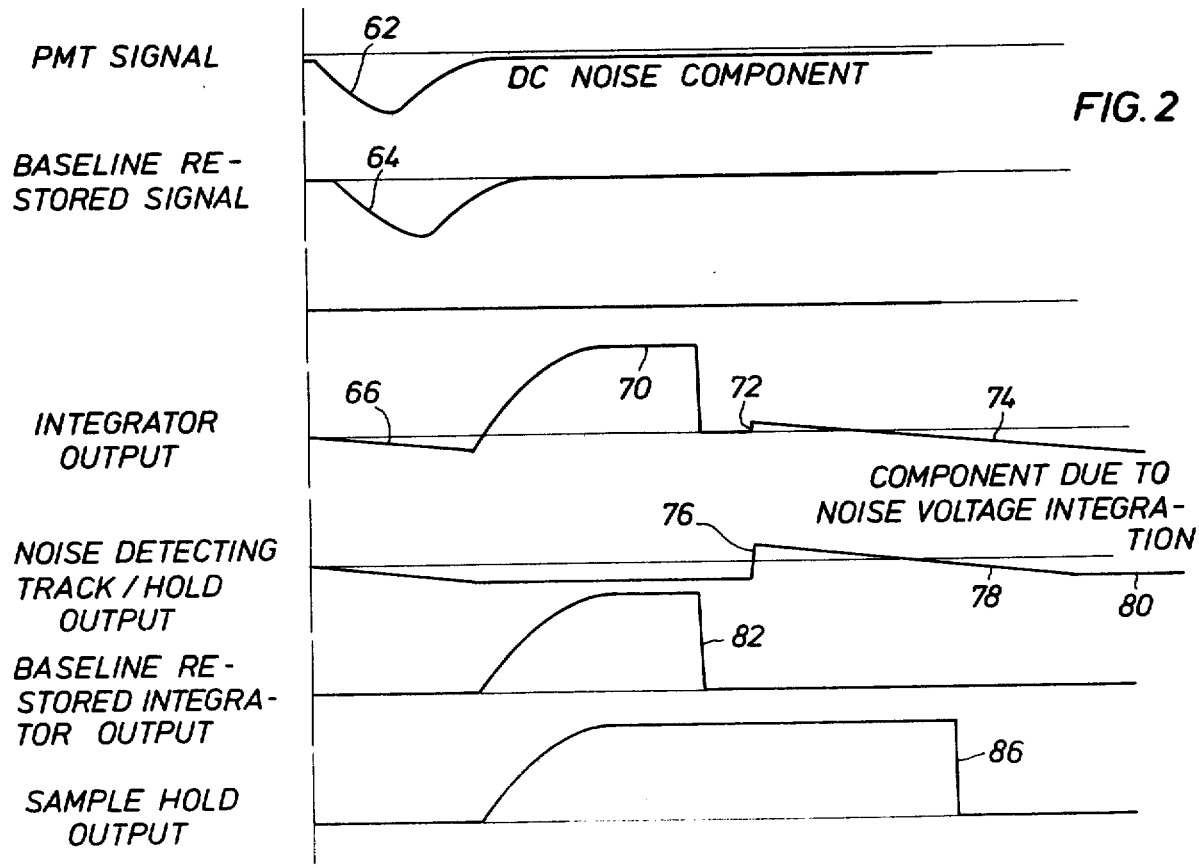
FIG. 2 is a chart of wave forms obtained at various locations in the apparatus drawn in schematic form in FIG. 1.

Attention is momentarily directed to FIG. 2 of the drawings. This shows a voltage wave form 62. This wave form 62 is the voltage observed at the output of the buffer amplifier 14. This pulse peak has an offset which is the DC noise component of the PMT 112. This offset value may vary but is generally found in the output. The feedback conductor 20 inputs a voltage which is equal in magnitude and polarity to the noise component. The wave form 64 is the base line restored signal. This is the signal output from the differential amplifier 18. It is this signal which is integrated.

The output of the integrator 22 is represented at 66. The current of the pulse shown at 64 is integrated to form the pulse 70. The area under the curve is the integral of the pulse 64 over a specified time period. The pulse 70 represents the integration of current pulse 64. There is, however, the ever present DC drift. Under control of the timing sequencer 30, this drift is recognized before the summation pulse 70 has actually begun to respond to the input pulse 64. A slight offset is shown at 72, and the base line value drifts at 74 in a direction and at a slope dependent on the error or offset. Whatever the case, this offset is accumulated or integrated and the drift 74, if extended, would drive the equipment into saturation downstream of the integrator. Eventually, the integrator would even be saturated. The system does not operate for this long a cycle. It is emphasized that there is drift present and over a period of time, the drift can become substantial.

The amplifier 38 is gated off by the signal from the timing sequencer 30. It is gated on at the time 76. This corresponds to a point in time after the summation pulse 70 has been integrated, digitized and restored substantially to zero. In other words, the amplifier 38 is not switched on until the time 72 of the wave form drawn thereabove. This error signal is thus amplified by the track and hold amplifier 38 (now gated on) and it follows or ramps in the same fashion at 78 corresponding to the ramp 74.

It will be observed that the amplifier 38 forms an output which is input to the differential amplifier 32 so that the wave form 76 is subtracted from the wave form drawn above it. It will be further appreciated that the voltage 78 ramps until the track and hold amplifier 38 is switched off. At this time, it goes into the next cycle of operation maintaining an offset plateau 80. The offset 80 is held for a portion of the next cycle. It is an offset added to the summation pulse 70 in the next cycle. This is accomplished by summing at the differential amplifier 32. The additive result is a summation pulse 82 which is output from the differential amplifier 32. This pulse has been restored to a corrected base line. All drift factors have been removed. Drift may arise from several sources but the drift has been overcome by the offset 80. The offset 80 is added to or underneath the pulse 70 to obtain the corrected summation pulse 82. The incremental scale factor of the feedback loop is determined in part by the count capacity of the counter 44 and the spacing of the set point voltages for the comparators 40 and 42. That, in turn, depends on the setting at the adjustable resistors 88 and 90.

The pulse 82 is input from the differential amplifier 32 to the sample and hold amplifier 34. After the amplifier 34 has had time to settle, it forms an output pulse 86. Needless to say, the input to the amplifier 34 can now be removed. The amplifier 34 holds its output voltage level for a required interval. Moreover, it is sufficiently stretched to provide an adequate time interval for the digitizer 36 to obtain the necessary input level, settle and form the digitized value. While this is going on, the integrator 22 is operating on the next cycle of operation to form the next integrated pulse.

From the foregoing, it will be seen how timing is achieved by signals on the conductors 28, 50, 52, 54 and 56. The initial step is to detect onset of the gamma induced pulse from the PMT after a selected interval. Also, onset detection triggers a signal for the track and hold amplifier 38 to hold as enabled by the signal on the conductor 50. This is illustrated at 72 in the wave forms. As will now be apparent, the offset level 80 will change from cycle to cycle. The offset 80 is an analog value which is input on the conductor 20. It is formed as a result of operation of bidirectional counting in the counter 44. That, in turn, is formed by strobed operation of the comparators 40 and 42. The offset 80 remains constant from cycle to cycle if there is no decrementing or incrementing pulse input to the counter 44. However, the formation of such pulses is dependent on changes in drift. If there is a change in error voltage requiring a changed offset voltage 80, this will be observed at the comparators. When they are strobed, one or the other (but not both) will form an output pulse which indicates to the counter that the offset needs changing. A new digital word is stored in the counter. It is smaller or larger as the case may be. It is then converted into an analog offset voltage which is applied on the conductor 20 for use in the differential amplifier 18 to offset the signal at that stage.

One important advantage of this system is that superimposed AC noise has an integral of zero. Integration of the pulse with AC noise superimposed on it basically yields no change at least over several cycles of operation depending on the frequency of the AC noise. If, for instance, it is very low frequency in comparison, it may produce error in one or two pulses, but the averaging that occurs over a period of time reduces the AC component to zero. Another important feature in this system is the fact that all the components are DC coupled and yet DC offset provides no error. The DC offset or error is accommodated in the feedback loop.

While the foregoing is directed to the preferred embodiment of the present invention, other and further embodiments of the invention may be devised without departing from the basic concept thereof, and the scope thereof is determined by the claims which follow.

I claim:

1. A system for converting analog output signals from a photomultiplier tube into digital signals proportional in magnitude to the charge current generated by the photomultiplier tube for use in a well logging system in a borehole penetrating earth formation, comprising:
    (a) differential amplifier means having a first input terminal for an input from a photomultiplier analog source and a second input for an offset error cancellation source to form an output signal;
    (b) means for integrating the output signal from said differential amplifier means under the control of a timing sequencer and producing an output signal;
    (c) means for generating an offset error cancellation signal, said means being responsive to an offset error detecting means;
    (d) means for generating, according to a predetermined relationship, timing signals in a predetermined sequence in response to a photomultiplier analog output signal;
    (e) means for sampling and holding said integrating means output signal in response to a timing signal from said timing sequencer; and
    (f) means for digitizing the output signal from said sampling and holding means to provide a digital word output signal.

2. The system of claim 1 wherein said differential amplifier means receives the offset error cancellation signal with said offset error generating means comprising:
    (a) an offset error detecting means;
    (b) an up and down counter;
    (c) digital to analog converter means connected to said counter; and
    (d) an output on said converter means connected to said differential amplifier means.

3. The system of claim 2 wherein said offset error detecting means comprises voltage level comparator means.

4. The system of claim 2 wherein said offset error detecting means comprises a pair of voltage level comparator means adjustable to levels bracketing inputs thereto to form an output comparison signal.

5. The system of claim 1 including control means for switching said means for sampling and holding between sampling holding to input a value to said digitizing means after holding.

6. The system of claim 5 wherein said digitizing means is operated to provide a digital word output signal after an input signal thereto has been held by said means for sampling and holding.

7. The system of claim 5 wherein said digitizing means is operated only after the input thereto has been held by said means for sampling and holding.

8. A system for converting light scintillations from radiation scintillation detector into digital signals representative of the intensity of such light scintillations for use in a downhole well logging tool comprising:
    a photomultiplier tube optically coupled to a radiation scintillation detector and having a load resistor for developing output voltage pulses thereacross proportional to current charge pulses produced in said photomultiplier by radiation entering said scintillation detector;
    an input differential amplifier having an output current signal and a first input terminal connected to receive said output voltage pulses from said photomultiplier and a second input terminal connected to receive a feedback correction voltage;
    integrator amplifier means having an input terminal connected to receive said output current signal from said input differential amplifier for generating an output voltage signal proportional to the total current applied to said integrator input;
    means for generating said feedback correction voltage as a function of any DC error component voltage generated by the sum of any amplifier offset voltage error, integrator current error, and photomultiplier tube DC noise component;
    sample and hold means for sampling and holding a peak value of said output voltage signal from said integrator amplifier means and for providing an output signal representative thereof; and
    digitizer means connected to said sample and hold means for producing a digital output signal representative of said output signal from said sample and hold means.

9. The system of claim 8 wherein said means for generating said feedback correction voltage includes:
    a DC offset error detecting circuit;
    a digital up and down counter having analog up and down input terminals and a digital output terminal; and
    a digital to analog converter connected to said digital output terminal and having an analog output connected to said second input terminal of said input differential amplifier.

10. The system of claim 9 wherein said DC offset error detecting circuit comprises positive and negative voltage level comparator means for comparing DC offset errors to a reference voltage and having outputs connected to said analog inputs of said up and down counter.

11. The system of claim 10, said offset error detecting circuit further comprising track and hold amplifier means connected to the output of said integrator amplifier for tracking and holding the value of the output signal of said integrator including any DC offset error.

* * * * *